United States Patent
Teramoto

(10) Patent No.: US 12,414,218 B2
(45) Date of Patent: Sep. 9, 2025

(54) LIGHT SOURCE APPARATUS

(71) Applicant: Ushio Denki Kabushiki Kaisha, Tokyo (JP)

(72) Inventor: Yusuke Teramoto, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 382 days.

(21) Appl. No.: 18/129,533

(22) Filed: Mar. 31, 2023

(65) Prior Publication Data

US 2023/0400786 A1    Dec. 14, 2023

(30) Foreign Application Priority Data

May 27, 2022    (JP) ................... 2022-086512

(51) Int. Cl.
  *H05G 2/00*    (2006.01)
(52) U.S. Cl.
  CPC ................... *H05G 2/0025* (2024.08)
(58) Field of Classification Search
  USPC ........................................ 250/504 R
  See application file for complete search history.

(56) References Cited

U.S. PATENT DOCUMENTS

| 10,672,584 B2 | 6/2020 | Teramoto et al. |
| 2008/0029717 A1* | 2/2008 | Shirai ............ H05G 2/009 356/51 |
| 2016/0073486 A1 | 3/2016 | Teramoto et al. |

FOREIGN PATENT DOCUMENTS

| JP | 2014-216286 A | 11/2014 |
| JP | 2016-18701 A | 2/2016 |
| JP | 6658324 B2 | 12/2017 |

OTHER PUBLICATIONS

International Search Report (ISR) for PCT/JP2023/017353 of Jul. 18, 2023, Which is Based Upon JP2022-086512, From Which the Current Application U.S. Appl. No. 18/129,533 Claims Foreigh Priority.

* cited by examiner

*Primary Examiner* — Kiet T Nguyen
(74) *Attorney, Agent, or Firm* — Yoshida & Associates LLC; Kenichiro Yoshida

(57) ABSTRACT

A light source apparatus includes a disk-shaped rotation body, a raw material supply mechanism, a chamber body, and a foil trap. The raw material supply mechanism supplies a front surface of the rotation body with liquid raw material that is irradiated with an energy beam to generate plasma. The chamber body includes a beam introduction section that introduces the energy beam, a radiation extraction section that extracts radiation from the plasma that has been generated, and a plasma generation section that accommodates the rotation body. The foil trap includes a shaft member rotatably disposed in the chamber body and a plurality of foils radially arranged around the shaft member, and the plurality of foils is arranged between the rotation body and the radiation extraction section to capture debris that has been generated from the plasma.

18 Claims, 6 Drawing Sheets

LIGHT SOURCE APPARATUS

CROSS-REFERENCE TO RELATED APPLICATION(S)

This application claims priority from Japanese Priority Patent Application No. 2022-086512 filed on May 27, 2022. The entire teachings of the above application are incorporated herein by reference.

BACKGROUND ART

The present invention relates to a light source apparatus applicable to the emission of X-rays, extreme ultraviolet light, or the like.

X-rays have been conventionally used for medical, industrial, and research applications. In the medical field, X-rays are used for such applications as chest radiography, dental radiography, and computed tomography (CT). In the industrial field, X-rays are used for such applications as non-destructive testing and tomographic non-destructive testing to observe the inside of materials such as structures and welds. In the research field, X-rays are used for such applications as X-ray diffraction to analyze the crystal structure of materials and X-ray spectroscopy (X-ray fluorescence analysis) to analyze the constituent elements of materials.

X-rays can be generated using an X-ray tube, in which a pair of electrodes (anode and cathode) are provided. When a high voltage is applied between the anode and cathode while a cathode filament is being heated by flowing an electric current therethrough, negatively-charged thermoelectrons that are generated at the filament collide with a target on the anode surface at high speed, generating X-rays from the target. In X-ray tubes, a technique is also known in which the target on the anode is a liquid metal jet, and this target is irradiated with an electron beam to produce X-rays with high brightness.

Extreme ultraviolet light (hereinafter referred to as EUV light) having a wavelength of 13.5 nm, which is in the soft X-ray region having a relatively long wavelength among X-rays, has been recently used for exposure light. The base material of a mask for EUV lithography, the mask being provided with fine patterns, is a substrate made of low-thermal-expansion glass including a reflective mirror composed of a multilayer film (e.g., molybdenum and silicon) for reflecting EUV light as a stacked structure. The EUV mask is fabricated on the multilayer film by patterning a material that absorbs radiation having a wavelength of 13.5 nm.

The size of unacceptable defects in EUV masks is much smaller than that of conventional ArF masks, making their detection difficult. Hence, EUV masks are usually inspected using radiation having a wavelength that matches the wavelength operated on lithography, which is called an actinic inspection. For example, when performed using radiation having a wavelength of 13.5 nm, an actinic inspection can detect defects with a resolution better than 10 nm.

EUV light source apparatuses generally include DPP (Discharge Produced Plasma) light source apparatuses, LDP (Laser Assisted Discharge Produced Plasma) light source apparatuses, and LPP (Laser Produced Plasma) light source apparatuses. The DPP type EUV light source apparatus applies a high voltage between electrodes between which discharge gas containing EUV radiation species (plasma raw material in the gas phase) is supplied to generate a high-density high-temperature plasma by the discharge, thus utilizing the extreme ultraviolet light radiated from the plasma.

The LDP light source apparatus is an improved version of the DPP light source apparatus. In the DPP light source apparatus, for example, a liquid high-temperature plasma raw material such as Sn (tin) or Li (lithium) containing EUV radiation species is supplied to the surface of the electrode (discharge electrode) at which the discharge occurs. The material is then irradiated with an energy beam such as a laser beam or an electron beam to vaporize the material, and then a high-temperature plasma is generated by discharge.

The LPP light source apparatus generates plasma by focusing a laser beam on a droplet that has been ejected in a form of a minute liquid droplet, which is the target material for EUV radiation, and by exciting the target material. The droplet is made of materials including tin (Sn) or lithium (Li).

In this way, the DPP method (LDP method) light source apparatus or the LPP method light source apparatus can be used as an EUV light source apparatus that generates EUV light in the soft X-ray region. Meanwhile, since the DPP method (LDP method) light source apparatus uses discharge between the electrodes to generate plasma, debris associated with EUV raw materials is likely to generate. In contrast, the LPP method light source apparatus is designed to set a minute droplet made of tin, which is EUV raw material, to be a target and focus a laser beam for excitation onto the target, thus making the configuration of the light source apparatus complex. In addition, in the LPP method light source apparatus, it is difficult to stably drop and supply the tin droplets, making the stable generation of EUV light difficult.

Japanese Patent No. 6658324 discloses a method in which a liquid target material for generating X-rays is applied to disk-shaped rotation bodies and the applied liquid material is irradiated with an energy beam (laser beam) to generate X-rays. This method is capable of obtaining high-brightness X-rays with a relatively simple configuration. A case in which the method described in Japanese Patent No. 6658324 is applied to an EUV light source apparatus corresponds to the LPP method. However, this method eliminates the need for supplying the EUV raw material in liquid in a form of a droplet. Hence, this method is capable of readily supplying the EUV material, and enables the liquid EUV material to be reliably irradiated with a laser beam, obtaining EUV radiation with a relatively simple configuration.

SUMMARY OF THE INVENTION

In the LPP method, as described above, the radiation (X-ray or EUV) raw material is irradiated with an energy beam (electron beam or laser beam) to generate plasma, from which radiation is extracted, however, debris is generated during plasma generation as is similar to the DPP method and the LDP method. In general, when liquid raw material on a flat surface is vaporized by an energy beam, debris constituted by liquid raw material emits the most in the normal direction of the flat surface. Hence, by making the normal direction different from the direction in which the radiation is extracted, it is possible to suppress the entry of debris in the direction in which the radiation is extracted.

However, since debris spreads in the space from the point of generation, part of the debris will travel in a direction in which the radiation is extracted. Debris reaching a utilization apparatus such as inspection equipment that uses the extracted radiation may contaminate the inside of the utilization apparatus or damage optical elements in the utilization apparatus, for example. Hence, it is necessary to suppress the entry of debris in the direction in which the radiation is extracted.

In view of the above circumstances, it is an object of the present invention to provide a light source apparatus capable of suppressing the entry of debris in the direction from which radiation is extracted.

A light source apparatus according to one aspect of the present invention includes a disk-shaped rotation body, a raw material supply mechanism, a chamber body, and a foil trap. The raw material supply mechanism supplies a front surface of the rotation body with liquid raw material that is irradiated with an energy beam to generate plasma. The chamber body includes a beam introduction section that introduces the energy beam, a radiation extraction section that extracts radiation from the plasma that has been generated, and a plasma generation section that accommodates the rotation body. The foil trap includes a shaft member rotatably disposed in the chamber body and a plurality of foils radially arranged around the shaft member, and the plurality of foils is arranged between the rotation body and the radiation extraction section to capture debris that has been generated from the plasma.

In the light source apparatus, the plasma raw material that has been supplied to the front surface of the rotation body is irradiated with an energy beam. This causes debris of the liquid raw material to scatter toward the radiation extraction section in addition to generating plasma and emitting radiation. In the light source apparatus, the plurality of foils constituting the foil trap is located between the rotation body and the radiation extraction section, thereby capable of capturing the debris that has been generated from the plasma and preventing the debris from entering the radiation extraction section.

The front surface of the rotation body may be a plane perpendicular to a rotation axis of the rotation body. In this case, the shaft member is disposed along a direction parallel to the rotation axis of the rotation body.

The foil trap may further include a cover member that has a space section that accommodates the plurality of foils in a rotatable manner. The cover member includes a first opening that allows the radiation to enter the space section, and a second opening that is communicated with the space section and allows the radiation that has been incident through the first opening to emit toward the radiation extraction section.

The cover member may further include a discharge pipe through which debris that has been collected from the space section is discharged toward an outside of the cover member.

The light source apparatus may further include a diagnostic section disposed in the chamber body to analyze the radiation. In this case, the cover member further includes a third opening that allows the radiation to enter the space section, and a fourth opening that is communicated with the space section and allows the radiation that has been incident through the third opening to emit toward the diagnostic section.

The shaft member may be disposed in a between-axes area that is defined as an area between a first axis that is a principal axis of radiation emitting from the rotation body toward the radiation extraction section, and a second axis that is a principal axis of radiation emitting from the rotation body toward the diagnostic section.

The plurality of foils may extend from the shaft member in a direction orthogonal to each of the first axis and the second axis.

The shaft member may be disposed along a direction different from each of an optical axis of the energy beam that is incident from the beam introduction section onto the rotation body and a principal axis of the radiation emitting from the rotation body toward the radiation extraction section.

The light source apparatus may further include a first gas supply section between the foil trap and the radiation extraction section, the first gas supply section forming air flowing from the radiation extraction section toward the shaft member.

The light source apparatus may further include a second gas supply section that forms air flowing across a direction of an axis of the shaft member, a direction of the optical axis of the energy beam, and a direction of the principal axis of the radiation.

The beam introduction section may include a cylindrical-shaped incident protrusion protruding toward an inside of the chamber body, and the incident protrusion may include an incident aperture at the front end thereof. The incident protrusion may have a cone shape with a cross-sectional area that decreases toward a side of the protrusion. The plasma generation section may be maintained in a reduced-pressure atmosphere than the beam introduction section.

The radiation extraction section may include a cylindrical-shaped outer protrusion protruding toward an outside of the chamber body. The outer protrusion may have a cone shape with a cross-sectional area that decreases toward a side of the protrusion. The plasma generation section may be maintained in a reduced-pressure atmosphere than the radiation extraction section.

The light source apparatus may further include a case section that has openings through which the energy beam and the radiation pass and that accommodates the rotation body.

The radiation may include X-rays or extreme ultraviolet light.

Effect of the Invention

The present invention is capable of suppressing the entry of debris in a direction from which radiation is extracted.

DETAILED DESCRIPTION OF THE EMBODIMENTS

Hereinafter, embodiments according to the present invention will be described with reference to the accompanying drawings.

Figure 1:
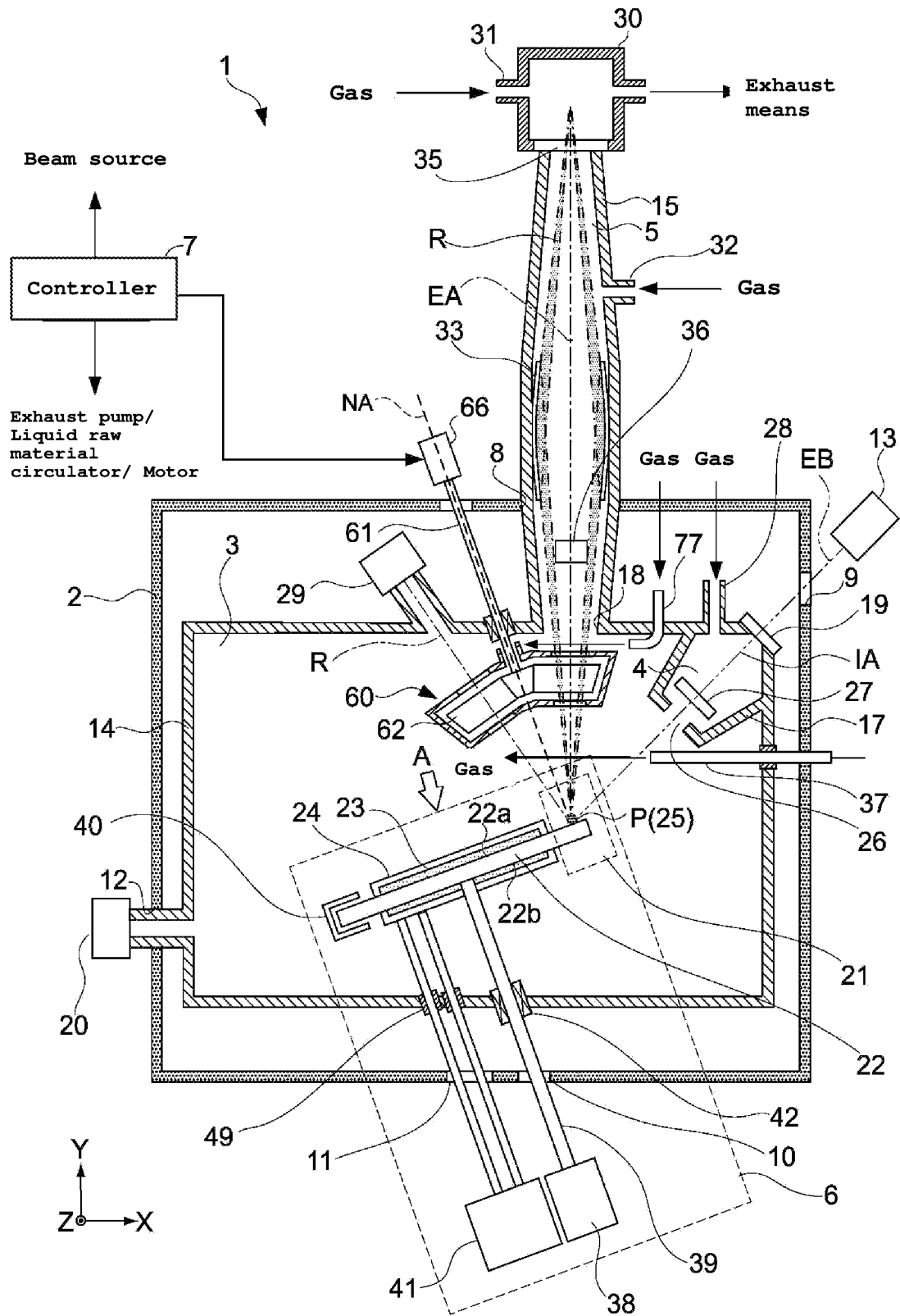
FIG. 1 is a schematic diagram illustrating a configuration example of a light source apparatus according to an embodiment of the present invention.

FIG. 1 is a schematic diagram illustrating a configuration example of a light source apparatus according to an embodiment of the present invention.

FIG. 1 illustrates a schematic cross section of the light source apparatus 1 when the light source apparatus 1 is cut along the horizontal direction at a predetermined height from its installation surface and viewed from above. In FIG. 1, in order to facilitate the understanding of the configuration and operation of the light source apparatus 1, omitted is the illustration of the cross section of portions that need not be described on the configuration of the cross section, for example. Hereinafter, the X direction denotes the left-right direction (the positive side of the X axis is the right side and the negative side is the left side), the Y direction denotes the front-rear direction (the positive side of the Y axis is the front side and the negative side is the rear side), and the Z direction denotes the height direction (the positive side of the Z axis is the upper side, and the negative side is the lower side). Obviously, the application of the present technology is not limited to the direction in which the light source apparatus 1 is used.

The light source apparatus 1 is an LPP method light source apparatus that extracts radiation R by transforming plasma raw material 23 into plasma with an energy beam EB. The light source apparatus 1 is capable of emitting the radiation R ranging from hard X-rays having a wavelength of 30 nm or less to soft X-rays (including EUV light), for example. Hence, the light source apparatus 1 can be used as an X-ray generator or an EUV light source apparatus (EUV radiation generator). Obviously, the present technology can also be applied to light source apparatuses that emit radiation in other wavelength bands.

The light source apparatus 1 includes an enclosure 2, a vacuum chamber 3, an energy beam incident chamber 4, a radiation emission chamber 5, a raw material supply mechanism 6, and a controller 7. The enclosure 2 is configured such that its external shape is approximately a cube. The enclosure 2 includes an emission hole 8 formed in the front face of the enclosure 2, an incident hole 9 formed in the right side face thereof, two through-holes 10 and 11 formed in the rear face thereof, and a through-hole 12 formed in the left side face thereof. The enclosure 2 can be made of any material; for example, the enclosure is made of metal.

In the present embodiment, the radiation R is set to allow its emission axis EA to pass through the emission hole 8 in the front face and extend in the Y direction (front-rear direction). The radiation R such as X-rays and EUV light is extracted along the emission axis EA and emitted through the emission hole 8 toward the front side. In the present embodiment, the energy beam EB is set to allow its incident axis IA to extend from the incident hole 9 on the right side face toward the rear side at an oblique angle to the left.

As shown in FIG. 1, a beam source 13 that emits the energy beam EB is disposed outside the enclosure 2. The beam source 13 is disposed to allow the energy beam EB to enter the interior of the enclosure 2 along the incident axis IA. Examples of the energy beam EB include an electron beam or a laser beam. The beam source 13 can be configured to employ any configurations capable of emitting these energy beams EB.

The light source apparatus 1 includes a metal chamber body 14. The chamber body 14 has the vacuum chamber 3, the energy beam incident chamber (hereinafter simply referred to as the incident chamber) 4, and the radiation emission chamber (hereinafter simply referred to as the emission chamber) 5. The vacuum chamber 3, the incident chamber 4, and the emission chamber 5 are spatially connected to each other. In other words, the vacuum chamber 3 and the incident chamber 4 are connected to each other. Similarly, the vacuum chamber 3 and the emission chamber 5 are connected to each other.

In the present embodiment, the chamber body 14 includes a cylindrical-shaped outer protrusion 15 protruding toward the front side of the chamber body 14, and an inner protrusion 17 protruding inward from the inner circumferential face of the chamber body 14. The outer protrusion 15 constitutes the emission chamber 5, and the inner protrusion 17 constitutes the incident chamber 4.

The vacuum chamber section 3 constitutes the "plasma generation section" that generates plasma by irradiating the plasma raw material 23 with the energy beam EB. The incident chamber section 4, the inner protrusion 17 and the like constitute the "beam introduction section" that introduces the energy beam. The incident chamber 4 is formed to be located on the incident axis IA of the energy beam EB. In the present embodiment, the inner protrusion 17 serves as the incident protrusion. Furthermore, the emission chamber section 5, the outer protrusion 15, and the like constitute the "radiation extraction section" that extracts and emits radiation from the generated plasma. The emission chamber 5 is disposed on the emission axis EA of the radiation R.

As shown in FIG. 1, an emission hole 18 is formed in the front face of the chamber body 14. The emission hole 18 is formed along the emission axis EA of the radiation R, and in line with the emission hole 8 in the front face of the enclosure 2. The outer protrusion 15 is configured to protrude toward the front side from the circumferential edge of the emission hole 18 in the chamber body 14. The outer protrusion 15 is configured to protrude toward the front side more than the emission hole 8 of the enclosure 2 with being inscribed in the emission hole 8 of the enclosure 2. The space surrounded by the outer protrusion 15 serves as the emission chamber 5. The outer protrusion 15 may be integrally formed with the chamber body 14; however, it may be separately formed and then connected to the chamber body 14.

The emission chamber 5 is configured to have a cone shape with its central axis being aligned with the emission axis EA of the radiation R. The emission chamber 5 is configured to have a large cross-sectional area at its center portion in the direction of the emission axis EA of the radiation R, and have the cross-sectional area being decreased toward the front and rear ends thereof. In other words, the emission chamber 5 is shaped to taper toward the front and rear ends thereof.

An incident window 19 is formed in the right-front corner of the chamber body 14. The incident window 19 is formed along the incident axis IA of the energy beam EB, and in line with the incident hole 9 in the right side face of the enclosure 2. The inner protrusion 17 is configured to protrude inside the right-front corner of the chamber body 14 along the incident axis IA of the energy beam EB from a position surrounding the incident window 19. In the internal space of the chamber body 14, the space surrounded by the inner protrusion 17 serves as the incident chamber 4. The inner protrusion 17 and the right-front corner of the chamber body 14 themselves, which are the components constituting the incident chamber 4, can also be referred to as the incident chamber. The inner protrusion 17 may be integrally formed with the chamber body 14; however, it may be separately formed and then connected to the chamber body 14.

The incident chamber 4 is configured to have a cone shape with its central axis being aligned with the incident axis IA of the energy beam EB. The incident chamber 4 is configured to have a cross-sectional area being decreased toward its end inside the chamber body 14 in the direction of the incident axis IA of the energy beam EB. In other words, the incident chamber 4 has a tapered shape toward the end thereof inside the chamber body 14.

In the internal space of the chamber body 14, the space excluding the internal space of the inner protrusion 17, which serves as the incident chamber 4, serves as the vacuum chamber 3. The components themselves constituting the vacuum chamber 3 can also be referred to as the vacuum chamber.

As shown in FIG. 1, the chamber body 14 has a portion that protrudes through the through-hole 12 in the left side face of the enclosure 2 to the outside of the enclosure 2, and the portion has a front end connected to an exhaust pump (vacuum pump) 20. The exhaust pump 20 exhausts the inside of the vacuum chamber 3 and depressurizes the vacuum chamber 3, the incident chamber, and the emission chamber, which are communicated with the vacuum chamber 3. This suppresses the attenuation of the radiation R generated in the vacuum chamber 3.

The incident chamber 4 and the emission chamber 5 are maintained at a higher pressure than that of the vacuum chamber 3 due to the differential pressure formed between them and the vacuum chamber 3 by being exhausted through the vacuum chamber 3. The inside of the vacuum chamber 3 is not necessarily a high-vacuum atmosphere, provided that it is a reduced-pressure atmosphere compared with the incident chamber 4 and the emission chamber 5. The inside of the vacuum chamber 3 may be supplied with an inert gas.

The raw material supply mechanism 6 is a mechanism for generating plasma P in a plasma generation area 21 in the vacuum chamber 3 and emitting the radiation R (X-rays, EUV light). The raw material supply mechanism 6 includes a disk-shaped rotation body 22 for supplying raw material, and a container 24 that accommodates the liquid-phase plasma raw material (radiation raw material) 23. The rotation body 22 and the container 24 are disposed inside the vacuum chamber 3.

As shown in FIG. 1, the disk-shaped rotation body 22 has an incident area 25 onto which the energy beam EB is incident. The rotation body 22 is disposed in the vacuum chamber 3 such that the incident area 25 is located at the intersection of the incident axis IA and the emission axis EA. The incident area 25 of the rotation body 22 is supplied with the plasma raw material 23 and irradiated with the energy beam EB incident thereon to generate the plasma P. The area (space) where the plasma P is generated in the vacuum chamber 3 becomes the plasma generation area 21. Accordingly, the plasma generation area 21 is an area corresponding to the position of the incident area 25 of the rotation body 22. The detail on the raw material supply mechanism 6 will be described later.

The controller 7 controls the operation of each component provided in the light source apparatus 1. For example, the controller 7 controls the operation of the beam source 13 and the exhaust pump 20. In addition, the controller 7 controls the operation of various motors, a plasma raw material circulator, a debris mitigation device (foil trap 60), an external voltage source, etc., which will be described later. The controller 7 includes computer hardware circuits necessary for computers, such as CPUs and memories (RAM, ROM). A CPU loads a control program stored in memory into RAM and executes it to perform various processes. The controller 7 may use a programmable logic device (PLD) such as a field programmable gate array (FPGA), and other devices such as application specific integrated circuit (ASIC). In FIG. 1, the controller 7 is schematically illustrated as a functional block; however, the controller 7 may be designed in any desired manner including the position in which the controller 7 is configured. In the present embodiment, the CPU of the controller 7 executes programs according to the present embodiment to execute the plasma generation method and the radiation emission method according to the present embodiment.

Hereinafter, the various chambers that constitute the light source apparatus 1, and the raw material supply mechanism 6 will be described in detail.

Incident Chamber

The incident chamber 4 is constituted by the inner protrusion 17 at the right-front corner of the chamber body 14. The incident window 19 is provided in the right-front corner of the chamber body 14. The energy beam EB emitted from the beam source 13 enters the incident chamber 4 through the incident window 19 along the incident axis IA. Note that the incident axis IA of the energy beam EB can also be referred to as the optical axis (principal axis) of the energy beam EB entering the incident chamber 4.

The incident window 19 is made of a material that is transmissive to the energy beam EB and is designed to have a thickness that can withstand a pressure difference between the inside and outside of the incident chamber 4. The incident window 19 can be a film made of metal such as titanium or aluminum when the energy beam EB is an electron beam. The incident window 19 can be made of glass material (quartz glass) when the energy beam EB is a laser beam. The incident window 19 can be made of any other materials that are transmissive to the energy beam EB. The incident window 19 is necessary to be thick enough to withstand the pressure difference between the inside and outside of the vacuum chamber 3.

The inner protrusion 17 protrudes toward the plasma generation area 21 and is provided with an incident aperture 26 at the front end of the protrusion. The incident aperture 26 is disposed in line with the incident window 19 along the incident axis IA of the energy beam EB. The incident aperture 26 allows the energy beam EB to be incident through the incident chamber 4 into the vacuum chamber 3. In other words, the energy beam EB traveling along the incident axis IA through the incident window 19 passes through the incident aperture 26 and enters the rotation body 22 disposed in the vacuum chamber 3.

The incident chamber 4 is provided with a capturing mechanism thereinside to capture scattered plasma raw material 23 and debris. In the example shown in FIG. 1, provided is a rotary window 27 that is a plate-shaped rotation member for transmitting the energy beam EB and capturing the plasma raw material 23 and debris, as the capturing mechanism. The rotary window 27 is configured to be disk-shaped, for example. The rotary window 27 is provided with a rotation shaft of a motor attached to its center, which is not shown in the figure. The motor rotates the rotation shaft, which in turn rotates the rotary window 27. The motor is driven and controlled by the controller 7. The motor is disposed outside the enclosure 2, and the rotation shaft is connected to the rotary window 27 through through-holes (not shown) that are formed in the enclosure 2 and the chamber body 14. A mechanical seal is used to introduce the rotation shaft into the chamber body 14, allowing the rotary window 27 to rotate while maintaining the atmosphere (gas atmosphere as will be described below) in the incident chamber 4. The rotation shaft that rotates the rotary window 27 is disposed at a location off from the incident axis IA of the energy beam EB. This allows the energy beam EB to travel through the beam transmission area of the rotary window 27 without being interfered with by the rotation shaft of the rotary window 27. Rotating the rotary window 27 makes it possible to increase the substantial area of the beam transmission area of the rotary window 27, achieving a longer service life of the rotary window 27 and reducing the frequency of replacement of the rotary window 27.

As shown in FIG. 1, the chamber body 14 is provided with a gas injection channel 28 that is connected to the incident chamber 4. Through the gas injection channel 28, gas is supplied to the incident chamber 4 from a gas supply system, which is omitted in the figure. The gas supplied is gas that has high transmittance to the energy beam EB, for example, a noble gas including argon (Ar) and helium (He). The gas is supplied to increase the pressure inside the incident chamber 4. In other words, supplying gas from the gas injection channel 28 to the incident chamber 4 enables the internal pressure of the incident chamber 4 to be maintained at a pressure sufficiently higher than the internal pressure of the vacuum chamber 3.

The inner protrusion 17 has a cone shape having a smaller cross-sectional area toward the side of the protrusion (the side in which the incident aperture 26 is formed). The incident aperture 26 is provided at the front end of the inner protrusion 17. This configuration is favorable for supplying gas to increase the internal pressure of the incident chamber 4. In addition, the inner protrusion 17 configured to have a cone shape contributes to reducing the space occupied by the inner protrusion 17 in the chamber body 14. This allows for more flexibility in designing the arrangement of other components, thereby downsizing the apparatus.

Emission Chamber

The emission chamber 5 has a cone shape with the emission axis EA as its central axis, and the front end (front end of the outer protrusion 15) of the emission chamber 5 is connected to a utilization apparatus such as a mask inspection apparatus. In the example shown in FIG. 1, an application chamber 30 is connected as a chamber that forms part of the utilization apparatus. The pressure inside the application chamber 30 may be atmospheric pressure. The interior of the application chamber 30 may be purged with gas (e.g., inert gas) introduced from a gas injection channel 31, if necessary. The gas inside the application chamber 30 may be exhausted by an exhaust means, which is omitted in the figure.

As shown in FIG. 1, the outer protrusion 15 is provided with a gas injection channel 32 that is connected to the emission chamber 5. Through the gas injection channel 32, gas is supplied to the emission chamber 5 from a gas supply device, which is omitted in the figure. The gas supplied is a gas that has high transmittance to the radiation R, for example, a noble gas such as argon and helium. Argon and helium can be used as a gas having high transmittance for both the energy beam EB and the radiation R. Hence, the same gas may be supplied to both the incident chamber 4 and the emission chamber 5. This case makes it possible to use a gas supply system in common, thus simplifying the apparatus. Obviously, the gas supplied to the incident chamber 4 may be different from the gas supplied to the emission chamber 5. The gas is supplied to increase the pressure inside the emission chamber 5. In other words, supplying gas from the gas injection channel 32 to the emission chamber 5 enables the internal pressure of the emission chamber 5 to be maintained at a pressure sufficiently higher than the internal pressure of the vacuum chamber 3.

Inside the emission chamber 5, provided is a collector (focusing mirror) 33 that guides and focuses the radiation R entering the emission chamber 5 into the utilization apparatus (inside the application chamber 30). In FIG. 1, the component of the radiation R that enters the emission chamber 5 and is focused is illustrated in hatching. The outer surface of the collector 33 is in contact with the inner surface of the emission chamber 5 (inner surface of the outer protrusion 15) for the purpose of cooling and alignment. The collector 33 may be, for example, a single-shell oblique-incidence reflector mirror. The collector 33 is made of metal such as aluminum (Al), nickel (Ni), or stainless steel.

The collector 33 is optionally provided with a reflective coating on the inner reflective surface thereof. The reflective coating that reflects the radiation R is suitably made of a material such as ruthenium (Ru). Instead of being a structure in which its body is coated with Ru, which is expensive, the collector 33 may be configured to have a body made of glass (silicon dioxide: $SiO_2$) and to make its inner surface be polished to form a radiation-reflecting surface. Although the collector made of glass has a lower reflectivity than the collector made of metal applied with a Ru coating, the material of the collector made of glass is much less expensive than that of the collector with a Ru coating, thereby enabling the collector 33 to be replaced more frequently.

As shown in FIG. 1, a filter film 35 is provided between the emission chamber 5 and the application chamber 30. The filter film 35 serves to physically separate the plasma generation area 21 in the vacuum chamber 3 from the application chamber 30 (physically separate the space), preventing the scattered plasma raw material 23 and debris from entering the application chamber 30. The filter film 35 is made of a material that transmits the radiation R generated in the plasma generation area 21. When the radiation R is X-rays, the filter film 35 is constituted by, for example, a beryllium thin film that has a very high transmittance for X-rays. When the radiation R is EUV light, the filter film 35 is made of zirconium (Zr), for example.

Although being supplied with gas, the inside of the emission chamber 5 has a reduced-pressure atmosphere because it is spatially connected to the vacuum chamber 3. In contrast, the inside of the application chamber 30 may have an atmospheric pressure as described above. In this case, there is a pressure difference between the emission chamber 5 and the application chamber 30. Accordingly, the filter film 35 has a thickness durable enough to withstand this pressure difference. In other words, the filter film 35 is configured to avoid destroying the reduced-pressure atmosphere in the emission chamber 5, which is spatially connected to the vacuum chamber 3.

A shielding member (central occultation) 36 is disposed inside the emission chamber 5. The shielding member 36 is disposed in line with the emission hole 18 of the chamber body 14, the emission hole 8 of the enclosure 2, and the filter film 35 along the emission axis EA of the radiation R. Among the radiation R emitted from the plasma P and entering the emission chamber 5, there may be the components of radiation that are not focused by the collector 33 and that travel in the emission chamber 5. At least part of this unfocused radiation components spread out while traveling. Typically, such radiation components are unusable with the utilization apparatus and often unnecessary. In the present embodiment, the shielding member 36 can block the radiation components that are not focused by the collector 33.

As shown in FIG. 1, the present embodiment is provided with a gas nozzle 37 at the rear side of the incident chamber 4 in a manner that extends in the left-right direction. The gas nozzle 37 is disposed in the right side face of the chamber body 14 via a seal member or the like. The gas nozzle 37 is connected to a gas supply device, which is omitted in the figure, and supplies gas to the chamber body 14. The gas nozzle 37 corresponds to a second gas supply section that will be described later and blow gas from the right side of the between-axes area located between the incident axis IA and the emission axis EA toward the left side thereof along the left-right direction. This makes it possible to move debris that is emitted from the plasma P in a direction away from the incident axis IA and the emission axis EA.

Raw Material Supply Mechanism

Figure 2:
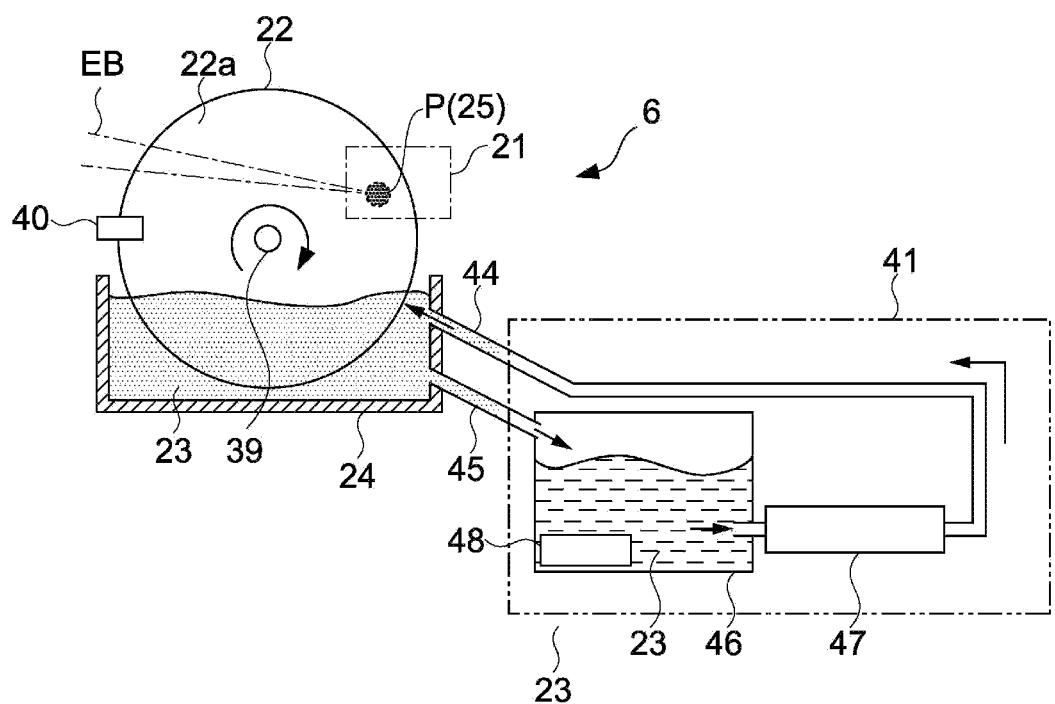
FIG. 2 is a schematic diagram illustrating a configuration example of a raw material supply mechanism.

FIG. 2 is a schematic diagram illustrating a configuration example of the raw material supply mechanism 6. FIG. 2 illustrates the rotation body 22 and the container 24 viewed from the direction of arrow A in FIG. 1. Accordingly, a front surface 22a of the rotation body 22 is illustrated in FIG. 2.

As shown in FIGS. 1 and 2, the raw material supply mechanism 6 includes the disk-shaped rotation body 22, the container 24, a motor 38, a skimmer 40, and a plasma raw material circulator 41.

The disk-shaped rotation body 22 has the front surface 22a and a back surface 22b, and includes the incident area 25 onto which the energy beam EB is incident and that is set at a predetermined position on the front surface 22a. Conversely, of the two main surfaces of the rotation body 22, the main surface where the incident area 25, onto which the energy beam EB is incident, is set is the front surface 22a. The opposite main surface is the back surface 22b. The front surface 22a and the back surface 22b of the rotation body 22 are planes perpendicular to the rotation axis (rotation shaft 39) of the rotation body 22. The rotation body 22 is made of a high-melting-point metal such as tungsten (W), molybdenum (Mo), or tantalum (Ta). The lower side of the rotation body 22 is partially immersed in the plasma raw material 23 stored in the container 24.

When X-rays are emitted as the radiation R, X-ray raw materials are used as the plasma raw material 23. The X-ray raw material is a metal that is in the form of liquid at room temperature. Examples of the X-ray raw material include gallium (Ga), and gallium alloys such as Galinstan (registered trademark), which is a eutectic alloy of gallium, indium (In), and tin (Sn). When EUV light is emitted as the radiation R, EUV raw materials are used as the plasma raw material 23. Examples of the raw material that emits EUV light include tin (Sn) and lithium (Li) in the form of liquid. Since Sn and Li are solid at room temperature, the container 24 is provided with a temperature control means, which is omitted in the figure. For example, when the EUV raw material is Sn, the container 24 is maintained at a temperature above the melting point of Sn.

The rotation shaft 39 of the motor 38 is connected to the center of the back surface 22b of the rotation body 22. The controller 7 controls the operation of the motor 38, which allows the rotation body 22 to rotate via the rotation shaft 39. The rotation shaft 39 is disposed to extend in a direction orthogonal to the front surface 22a of the rotation body 22. Hence, the rotation body 22 rotates around the direction orthogonal to the front surface 22a. The rotation shaft 39 passes through the through-hole 10 in the enclosure 2 and is introduced into the vacuum chamber 3 via a mechanical seal 42. The mechanical seal 42 allows the rotation shaft 39 to rotate while maintaining a reduced-pressure atmosphere in the vacuum chamber 3.

The rotation body 22 rotates around the rotation shaft 39 in a state in which a part of the lower side of the rotation body 22 is immersed in the plasma raw material 23 stored in the container 24. This causes the plasma raw material 23 to be pulled up from the raw material storage portion of the container 24 in a manner that the plasma raw material 23 has spread over the front surface 22a of the rotation body 22 due to its wettability with the front surface 22a of the rotation body 22, and to be transported. Accordingly, the motor 38 and the rotation shaft 39 serve as a raw material supply section that applies the raw material to at least a part of the front surface 22a of the rotation body 22. As shown in FIG. 2, in the present embodiment, the incident area 25 onto which the energy beam EB is incident is set in the vicinity of the circumferential edge of the front surface 22a of the rotation body 22. The configuration and operation of the raw material supply section (motor 38 and rotation shaft 39) are suitably designed to supply this incident area 25 with the plasma raw material 23.

A skimmer 40 is disposed at a predetermined position on the circumferential edge of the rotation body 22 as a layer thickness adjustment member for adjusting the layer thickness of the plasma raw material 23 that has been supplied on the front surface 22a of the rotation body 22 to a predetermined thickness. The skimmer 40 is, for example, a structure having a channel structure, and is positioned with a predetermined gap in a manner that the rotation body 22 is sandwiched thereinside. The skimmer 40 serves as a scraper to scrape off part of the plasma raw material 23 that has been applied to the front surface 22a of the rotation body 22.

The interval between the front surface 22a of the rotation body 22 and the skimmer 40 corresponds to the layer thickness of the plasma raw material 23 in the incident area 25 of the front surface 22a of the rotation body 22 onto which the energy beam EB is incident. The skimmer 40 is disposed at a location such that the layer thickness of the plasma raw material 23 in the incident area 25 of the front surface 22a of the rotation body 22 can be adjusted to a predetermined thickness. The interval between the front surface 22a of the rotation body 22 and the skimmer 40 is appropriately set. This setting allows the liquid raw plasma material 23 that has been applied to the rotation body 22 in the raw material storage portion of the container 24 to be adjusted such that the layer thickness on the rotation body 22 becomes a predetermined layer thickness when the liquid raw plasma material 23 passes through the skimmer 40 due to the rotation of the rotation body 22.

The plasma raw material 23 on the rotation body 22, the thickness of which has been adjusted by the skimmer 40, is transported to the incident area 25, onto which the energy beam EB is incident, due to the rotation of the rotation body 22. In other words, the direction of rotation of the rotation body 22 is a direction in which the plasma raw material 23 on the rotation body 22 passes through the skimmer 40 and then is transported to the incident area 25. In the incident area 25, the plasma raw material 23 on the rotation body 22 is irradiated with the energy beam EB to generate the plasma P. The skimmer 40 makes it possible to nearly uniformly supply the plasma raw material 23 to the incident area 25. Stabilizing the thickness of the plasma raw material 23 in the incident area 25 makes it possible to stabilize the intensity of the radiation R emitted from the plasma P. In the present embodiment, the skimmer 40 provides a thickness adjustment mechanism that adjusts the thickness of the plasma raw material that is supplied to the front surface.

The plasma raw material circulator 41 appropriately replenishes the container 24 with the plasma raw material 23 when the plasma raw material 23 is consumed due to the operation of generating the radiation R. The plasma raw material circulator 41 also serves as a temperature adjustment mechanism (cooling mechanism) for the plasma raw material 23.

As shown in FIG. 2, the plasma raw material circulator 41 includes a raw material inlet pipe 44, a raw material outlet pipe 45, a raw material storage tank 46, a raw material drive section (pump) 47, and a temperature adjustment mechanism 48. The raw material storage tank 46 stores the plasma raw material 23. The raw material inlet pipe 44 and the raw material outlet pipe 45 are disposed between the raw material storage tank 46 and the container 24 to communicate the raw material storage tank 46 with the container 24. The raw material drive section 47 is disposed in the raw material inlet pipe 44. Driving the raw material drive section 47 allows the plasma raw material 23 that has been stored in the raw material storage tank 46 to flow into the raw material inlet pipe 44, circulating the plasma raw material 23 in the circulation system of the raw material storage tank 46, the raw material inlet pipe 44, the container 24, and the raw material outlet pipe 45. Examples of the raw material drive section 47 include an electromagnetic pump capable of transporting liquid metal (plasma raw material 23) using magnetic force; however, other types of pumps may also be used.

In the present embodiment, the raw material storage tank 46 and the raw material drive section 47 are disposed outside the vacuum chamber 3 and also outside the enclosure 2. The raw material inlet pipe 44 and the raw material outlet pipe 45, which extend from the plasma raw material circulator 41 to the container 24, pass through the through-hole 11 in the enclosure 2, are introduced into the vacuum chamber 3 via a seal member 49, and are connected to the container 24. The seal member 49 allows the raw material inlet pipe 44 and the raw material outlet pipe 45 to penetrate from the outside to the inside of the vacuum chamber 3 while maintaining a reduced-pressure atmosphere in the vacuum chamber 3.

The plasma raw material 23 that has been applied onto the front surface 22a of the rotation body 22 is consumed at the area that is irradiated with the energy beam EB. Hence, in order to stably operate the generation of the radiation R (X-ray or EUV light) for a long period of time, a large volume of the plasma raw material 23 needs to be stored in the container 24. Meanwhile, the size of the container 24 that can be accommodated inside the vacuum chamber 3 is limited by the size of the vacuum chamber 3 of the light source apparatus 1, thus there may be many cases in which the container 24 fails to store a large volume of the plasma raw material 23. Hence, the raw material storage tank 46 capable of storing a large volume of the plasma raw material 23 is disposed outside the vacuum chamber 3, and is configured to replenish the raw material storage portion of the container 24 with the plasma raw material 23 via the raw material inlet pipe 44. This configuration allows the amount of the plasma raw material 23 in the raw material storage portion of the container 24 to be maintained at a constant level over a long period of time, thus enabling the stable operation of generating the radiation R over a long period of time. In other words, the plasma raw material circulator 41 circulates the plasma raw material 23 between the raw material storage portion of the container 24 and the raw material storage tank 46 such that the amount of the plasma raw material 23 in the raw material storage portion of the container 24 is maintained at a constant level.

When the plasma raw material 23 that has been applied onto the front surface 22a of the rotation body 22 is irradiated with the energy beam EB, the radiation R is generated from the plasma raw material 23 (target), and at the same time, the rotation body 22 itself is heated. When this heated rotation body 22 passes through the raw material storage portion of the container 24 in which the plasma raw material 23 is stored, the heat in the heated rotation body 22 is transferred to the plasma raw material 23 in the container 24. Hence, the temperature of the plasma raw material 23 in the container 24 gradually varies. When the viscosity of the plasma raw material 23 varies with temperature, variations in the temperature of the plasma raw material 23 cause variations in the wettability of the plasma raw material 23 with respect to the rotation body 22, thereby varying the adhesion state of the plasma raw material 23 to the rotation body 22. As a result, the output of the radiation R may also vary.

The plasma raw material circulator 41 according to the present embodiment includes the raw material storage tank 46 that has a relatively large capacity outside the vacuum chamber 3 (outside the enclosure 2). Hence, even if the plasma raw material 23 that has varied in temperature in the raw material storage portion of the container 24 flows into the raw material storage tank 46 via the raw material outlet pipe 45, the temperature of the plasma raw material 23 in the raw material storage tank 46 does not vary much and remains nearly constant. The plasma raw material 23, the temperature of which is maintained nearly constant, flows into the container 24 via the raw material inlet pipe 44. In this way, circulating the plasma raw material 23 through the plasma raw material circulator 41 enables the temperature of the plasma raw material 23 in the container 24 to be maintained at a nearly constant level. Therefore, this configuration is also capable of stabilizing the adhesion state of the plasma raw material 23 to the rotation body 22, stabilizing the output of the radiation R.

In addition, the temperature of the plasma raw material 23 in the raw material storage tank 46 may be adjusted by the temperature adjustment mechanism 48 that is provided inside the raw material storage tank 46. Since the raw material storage tank 46 is disposed outside the vacuum chamber 3 (outside the enclosure 2), the temperature adjustment mechanism 48 can have a large capacity, which is unaffected by the size of the vacuum chamber 3. This makes it possible to reliably adjust the temperature of the plasma raw material 23 to a predetermined temperature in a short time.

In this way, utilizing the plasma raw material circulator 41 including the temperature adjustment mechanism 48 makes it possible to supply the raw material storage portion of the container 24 with the plasma raw material 23 while maintaining the temperature of the plasma raw material 23 at a constant level. For example, in the case that a liquid metal whose temperature in its liquid state is lower than room temperature is used as the plasma raw material 23, this configuration also makes it possible to supply the container 24 with the plasma raw material 23 in the liquid phase while maintaining the temperature thereof lower than room temperature. Alternatively, in the case that a liquid metal whose temperature in its liquid state is higher than room temperature is used as the plasma raw material 23, this configuration also makes it possible to supply the container 24 with the plasma raw material 23 in the liquid phase while maintaining the temperature thereof higher than room temperature.

Figure 3:
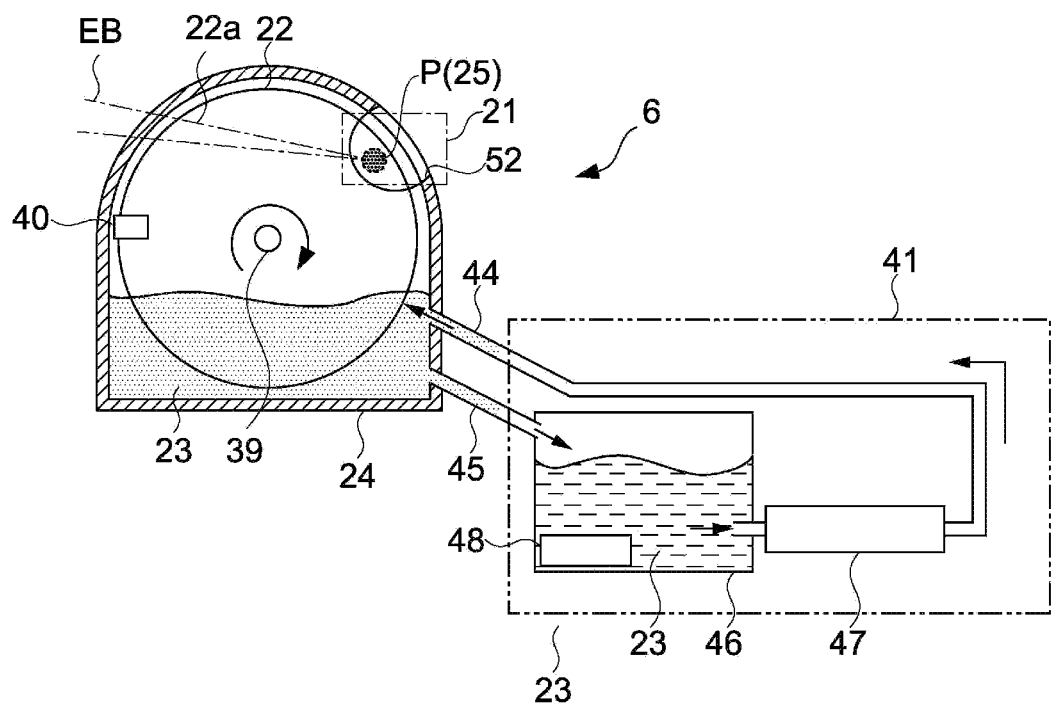
FIG. 3 is a schematic diagram illustrating another configuration example of the raw material supply mechanism.

FIG. 3 is a schematic diagram illustrating another configuration example of a container applicable to the light source apparatus 1. In the example shown in FIG. 3, the container 24 is configured as a cover structure, which can enclose nearly the entire rotation body 22. The container 24 is provided with an opening 52 at a position corresponding to the incident area 25 that is set on the front surface 22a of the rotation body 22. The energy beam EB is incident onto the incident area 25 through the opening 52 to generate the plasma P. In addition, the radiation R is extracted from the plasma P through the opening 52 and is emitted through the emission chamber 5.

Configuring the container 24 as a cover structure allows the plasma raw material 23 scattered from the rotation body 22 to adhere to the inner walls of the container 24, except for the opening 52 of the container 24. The plasma raw material 23 that has adhered to the inner walls moves to the raw material storage portion at the bottom of the container 24. Hence, the plasma raw material 23 hardly disperses into the space inside the vacuum chamber 3, which is the space outside the container 24. Therefore, this configuration is capable of sufficiently preventing the scattered plasma raw material 23 from adhering to the inner walls of the vacuum chamber 3. Accordingly, the container 24 corresponds to a case section that has the opening through which the energy beam EB and radiation R pass and that accommodates the rotation body 22.

As shown in FIG. 1, in the present embodiment, a radiation diagnostic section 29 is provided on the front side of the chamber body 14 and in the area spatially connected to the vacuum chamber 3. The radiation diagnostic section 29 is disposed at a position onto which the radiation R emitted in a direction different from the emission axis EA is incident. The radiation diagnostic section 29 measures the physical state of radiation R and includes a detector that detects the presence or absence of the radiation R and a measurement device that measures the output of the radiation R.

Process of Generating the Radiation R
Raw Material Supply

The rotation body 22 rotates around the rotation shaft 39 with the state in which a part of the lower side of the rotation body 22 is immersed in the plasma raw material 23 stored in the container 24. The plasma raw material 23 is pulled up from the raw material storage portion of the container 24 in a manner that it spreads over the front surface 22a of the rotation body 22 due to its wettability with the front surface 22a of the rotation body 22. The plasma raw material 23, which has been applied onto the front surface 22a of the rotation body 22, is then transported to the incident area 25 onto which the energy beam EB is incident. As shown in FIG. 2, the direction of rotation of the rotation body 22 is a direction in which the plasma raw material 23 supplied to the front surface 22a of the rotation body 22 is pulled up from the raw material storage portion of the container 24, passes through the skimmer 40, and reaches the plasma generation area 21 (incident area 25).

Plasma Generation

The plasma raw material 23, which has passed the skimmer 40 and the layer thickness of which on the rotation body 22 has been adjusted, reaches the incident area 25 on the rotation body 22. Then the energy beam EB is emitted from the beam source 13 along the incident axis IA toward the incident area 25. The energy beam EB passes through the incident hole 9, the incident window 19, the rotary window 27, and the incident aperture 26, and is incident onto the incident area 25 on which the plasma raw material 23 has been supplied. The energy beam EB incident onto the incident area 25 heats and excites the plasma raw material 23 present on the incident area 25 to generate a high-temperature plasma P. The high-temperature plasma P generated in the plasma generation area 21 emits the radiation R having a predetermined wavelength.

Extraction of the Radiation R

The radiation R emitted from the high-temperature plasma P travels in various directions. Of the radiation R, the radiation R entering the emission chamber 5 passes through the emission chamber 5 and is guided to the utilization apparatus (application chamber 30) such as a mask inspection apparatus. In other words, of the radiation R emitted from the high-temperature plasma P, the component that enters the emission chamber 5 is extracted to the outside along the emission axis EA.

Countermeasures Against Scattering Plasma Raw Material and Debris

In the process of supplying the plasma raw material 23, the rotation of the rotation body 22 often causes the plasma raw material 23 adhering to the front surface 22a of the rotation body 22 to be scattered by a centrifugal force. In the process of generating plasma P, when the plasma raw material 23 that has been applied onto the rotation body 22 is irradiated with the energy beam EB, a part of the plasma raw material 23 vaporizes. At that time, a part of the plasma raw material 23 (particles of the plasma raw material 23) is released as debris. For example, ions, neutral particles, electrons, or the like are released as debris together with the radiation R. The generation of the plasma P may also involve the sputtering of the rotation body 22, thus releasing material particles of the rotation body 22 as debris.

When debris constituted by plasma raw material (e.g., tin (Sn) in the case of EUV radiation) is incident in a direction of the emission axis EA of the radiation R and finally reaches the utilization apparatus (application chamber 30), the debris may damage or contaminate the reflective layer of optical elements in the utilization apparatus and degrade its performance. Hence, it is important to reduce the amount of debris traveling in the direction of the emission axis EA by suppressing the debris from traveling in the direction of the emission axis EA or changing the traveling direction of the debris, in order to prevent such debris from reaching the utilization apparatus.

For this purpose, in the above example, a gas transparent to radiation R (X-rays or EUV) is injected into the inside of the emission chamber 5 from the gas injection channel 32. This maintains the vacuum chamber 3 (plasma generation section) in a reduced-pressure atmosphere more than the emission chamber 5 (radiation extraction section), thereby preventing debris from entering the radiation emission section.

Typically, debris consisting of liquid raw material released upon the vaporization of liquid raw material located on a plane by an energy beam is released the most in the normal direction of the plane. Hence, as shown in FIG. 1, by making the optical axis (emission axis EA), which is the direction of the extraction of the radiation R, differ from the normal axis NA of the front surface 22a of the rotation body 22 that is irradiated with the energy beam differ with each other, this makes it possible to suppress debris from entering the emission chamber 5.

The light source apparatus 1 uses the gas nozzle 37 to supply gas in a direction that crosses at least the normal direction NA and the direction of the emission axis EA of radiation R, and that finally reaches the normal NA direction. This gas causes at least part of debris emitted in the normal direction NA to be moved away from the emission axis EA of the radiation R (changing the traveling direction of the debris), thereby further suppressing debris from traveling in the direction of the emission axis EA of the radiation R (toward the emission chamber 5).

Meanwhile, since debris spreads out in the space from the point of generation, part of the debris also travels in the direction of the emission axis EA of the radiation R (toward the emission chamber 5). Hence, in the present embodiment, a debris mitigation device (also referred to as debris mitigation tool (DMT)) that reduces the amount of debris entering the emission chamber 5 is disposed between the emission chamber 5 and radiation diagnostic section 29, and the plasma generation area 21. In the present embodiment, the foil trap 60 is employed as the DMT. The details of the foil trap 60 will be described below.

Foil Trap

The following is a detailed description of the foil trap Typically, the foil trap includes a plurality of foils (thin films or thin flat plates) arranged to divide the space into smaller spaces. Each space finely divided by the plurality of foils serves the function of reducing the conductance and increasing the pressure in the space. When debris travels through each of the spaces divided by these foils (areas of increased pressure), the probability of collision between the debris and atmosphere gas in these areas with increased pressure increases. This reduces the scattering velocity of the debris and changes the traveling direction of the debris, hence the debris is captured by the debris mitigation device.

There are two types of foil traps: a fixed foil trap in which the position of the plurality of foils is fixed, and a rotary foil trap in which the action of actively colliding with debris is added to the plurality of foils. In the rotary foil trap, the plurality of foils are arranged radially around a rotation shaft disposed in the center, and rotating the plurality of foils around the rotation shaft makes the debris flying from the plasma collide with the foils. The rotary foil trap is particularly effective in capturing debris that scatters at relatively low speeds. A single debris mitigation device may be provided with both of the rotary foil trap and the fixed rotary trap, or only one of the two traps. In the present embodiment, only a rotary foil trap is employed.

Figure 4:
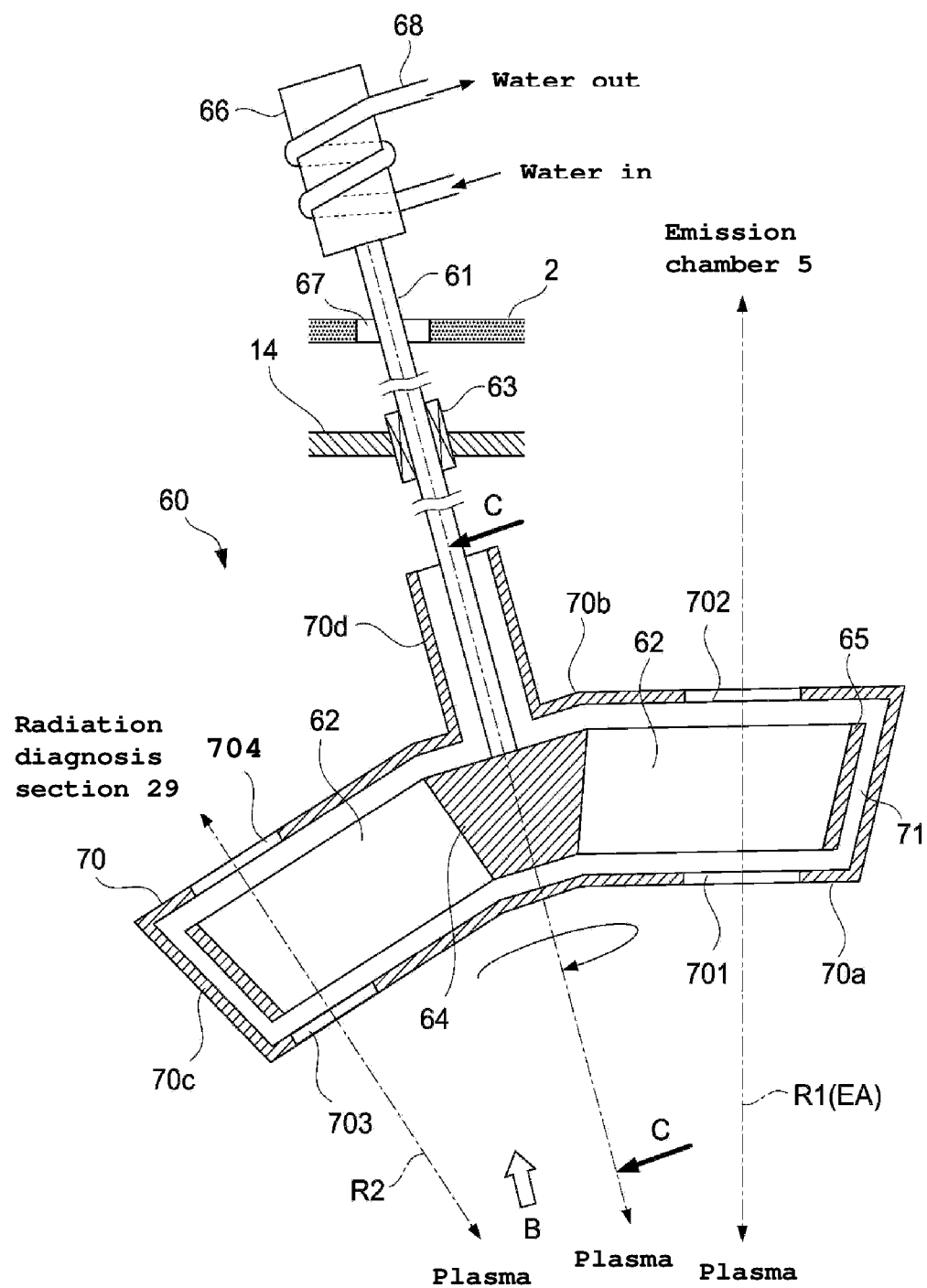
FIG. 4 is an enlarged cross-sectional view illustrating a configuration example of a foil trap in the light source apparatus.
Figure 5:
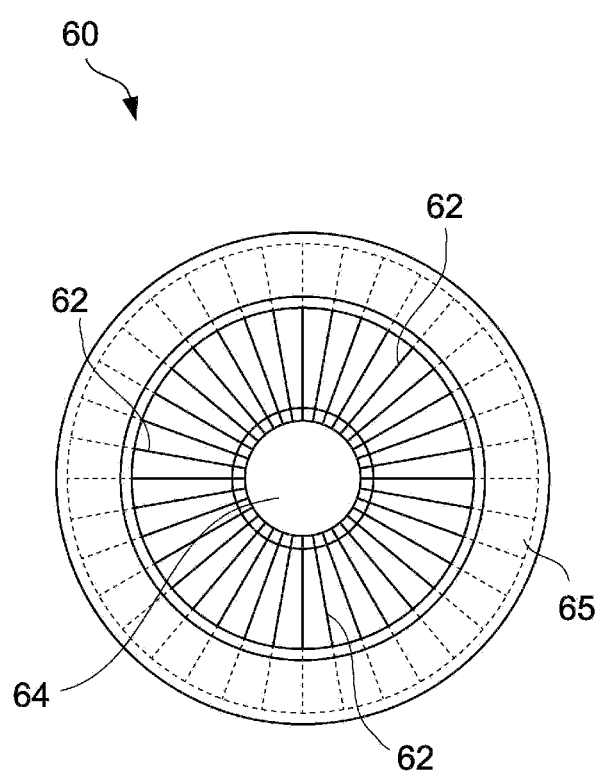
FIG. 5 is a diagram viewed from the direction of arrow B in FIG. 4 (the cover member is omitted).
Figure 6:
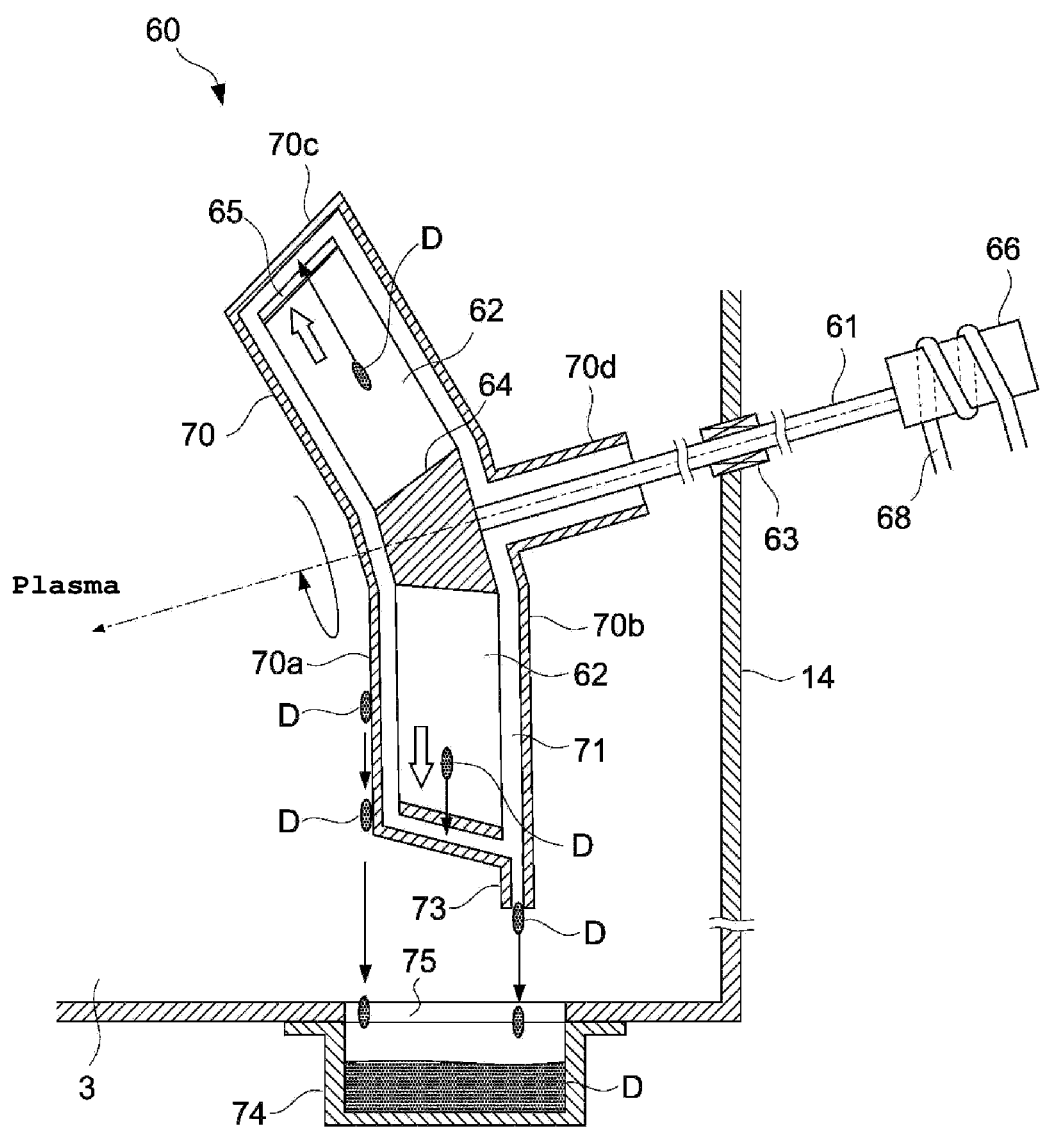
FIG. 6 is a cross-sectional view taken along line C-C in FIG. 4.

FIG. 4 is an enlarged cross-sectional view illustrating a configuration example of the foil trap 60 according to the present embodiment, FIG. 5 is a diagram viewed from the direction of arrow B in FIG. 4 (cover member 70 is not shown), and FIG. 6 is a cross-sectional view taken along the line C-C in FIG. 4.

As shown in FIGS. 4 to 6, the foil trap 60 includes a shaft member 61 disposed rotatably in the chamber body 14, and a plurality of foils (blades) 62 arranged radially around the shaft member 61. The shaft member 61 is supported by the chamber body 14 via a mechanical seal 63. The mechanical seal 63 maintains a reduced-pressure atmosphere in the vacuum chamber 3 while allowing for the rotation of the shaft member 61. The shaft member 61 is the rotation shaft of a motor 66 disposed outside the enclosure 2. The plurality of foils 62 are thin films or thin flat plates and are arranged at equal angular intervals around the circumferential face of a hub 64 attached to the front end of the shaft member 61. Each foil 62 is located on a plane that includes the central axis line of the shaft member 61 and the hub 64.

The hub 64 has a conical trapezoidal shape with its front end having a smaller diameter than its opposite side, and the plurality of foils 62 each extend in a direction orthogonal to the circumferential face of the hub 64. Thus, as shown in FIGS. 4 and 6, each foil 62 is arranged to be tilted at a predetermined angle toward the rotation body 22 with respect to the axis direction of the shaft member 63. The foil trap 60 further includes an outer ring 65 to which the front ends of the plurality of foils 62 are inscribed. The outer ring 65 is concentric with the hub 64 and has a conical trapezoidal shape with its end having a smaller diameter than its opposite side. Each foil 62 is disposed between the hub 64 and the outer ring 65. The shaft member 61, each foil 62, the hub 64, and the outer ring 65 are made of a high-melting-point metal, such as tungsten and/or molybdenum.

The shaft member 61 of the foil trap 60 is disposed along a direction parallel to the rotation axis (rotation shaft 39) of the rotation body 22, i.e., the normal direction NA of the front surface 22a of the rotation body 22. This configuration enables the plurality of foils 62 of the foil trap 60 to be arranged parallel or nearly parallel to the ray direction of the radiation traveling toward the emission chamber 5 so as not to block the radiation R (X-rays or EUV) traveling from the plasma generation area 21 toward the radiation emission section (emission chamber 5). In other words, as shown in FIG. 4, the foil trap 60 with each foil 62 positioned in a plane including the central axis of the hub 64 is disposed such that the plasma P (emission point) is located on an extended line of the central axis of the hub 64. This allows the radiation to be blocked only by the thickness of each foil 62, except for the hub 64 and the outer ring 65, thereby maximizing the fraction of radiation R (also called transmittance) that passes through the foil trap 60.

As shown in FIG. 4, the hub 64 is driven by the motor 66 to rotate around the axis of the shaft member 61. The central axis of the hub 64 matches the central axis of the shaft member 61. The foil trap 60 is driven by the motor 66 to rotate, and each of the rotating foils 62 collides with debris flying from the plasma P to capture the debris and prevents the debris from entering the emission chamber 5 and the utilization apparatus (application chamber 30) beyond it.

The foil trap 60 is disposed in the vacuum chamber 3, whereas the motor 66 is disposed outside the enclosure 2 that surrounds the vacuum chamber 3. The wall of enclosure 2 is formed with a through-hole 67 through which the shaft member 61 passes.

The foil trap 60 becomes hot due to radiation from the plasma P. Hence, to prevent the overheating of the foil trap the foil trap 60 may be configured to be coolable by making the shaft member 61 hollow through which cooling water is allowed to circulate. Since the motor 66 itself also generates heat during rotation, water cooling piping 68 may be wrapped around the motor 66 to remove heat. The water cooling piping 68 is filled with water to cool the motor 66 through heat exchange.

As shown in FIGS. 1, 4, and 6, the foil trap 60 further includes a cover member 70. The cover member 70 surrounds the plurality of foils 62 and the hub 64, preventing debris that has been trapped by the foils 62 from scattering into the interior of the vacuum chamber 3.

The cover member 70 includes a front section 70a facing the front surface 22a of the rotation body 22, a rear section opposite the front section 70a, a circumferential section that is provided between the circumferential edge of the front section 70a and the circumferential edge of the rear section 70b and facing the outer ring 65, a cylindrical section 70d that is provided at a center section of the rear section 70b and surrounding a part of the shaft member 61. The front section 70a, the rear section 70b, and the circumferential section 70c form a space section 71 that accommodates the plurality of foils 62 and the hub 64 in a rotatable manner. The cylindrical section 70d is formed concentrically with the shaft member 61 and surrounds the shaft member 61 protruding from the cover member 70 toward the motor 66 for a predetermined length.

The cover member 70 is made of a high-melting-point metal such as tungsten (W), molybdenum (Mo), or tantalum (Ta). The cover member 70 is fixed to the chamber body 14 using a supporter that is omitted in the figures, and thus is statically disposed in the vacuum chamber 3.

The cover member 70 has a first opening 701, a second opening 702, a third opening 703, and a fourth opening 704. The first opening 701 and the third opening 703 are provided in the front section 70a of the cover member 70, and the second opening 702 and the fourth opening 704 are provided in the rear section 70b of the cover member 70. The first through fourth openings 701-704 can have any shape; typically, they are formed in circular, but may be formed in other shapes such as oval or rectangular.

The first opening 701 allows, of radiation R emitted from the emission point of the plasma P, radiation R1 (see FIG. 4) traveling toward the emission chamber 5 (in the direction of the emission axis EA) to enter the space section 71. The second opening 702 is communicated with the space section 71 and allows the radiation R1 that has entered through the first opening 701 to be emitted toward the emission chamber 5. The third opening 703 allows, of radiation R emitted from the emission point of the plasma P, radiation R2 (see FIG. 4) traveling toward the radiation diagnostic section 29 to enter space section 71. The fourth opening 704 is communicated with the space section 71 and allows the radiation R2 that has entered the third opening 703 to be emitted toward the radiation diagnostic section 29.

Part of the debris that collides with the foils 62 of the foil trap 60 is deposited on the foils 62. Each foil 62 is heated by radiation from the plasma P and can be kept above the melting point of the debris by appropriate heat removal. For example, when the debris is made of tin (Sn), the temperature of the foil 62 can be kept above the melting point of tin (approximately 232° C.). Hence, the debris will not continue to accumulate on the foil 62. As shown in FIG. 6, liquid debris D on the foil 62 moves on the foil 62 due to the centrifugal force generated by the rotation of the foil 62, and eventually leaves the foil trap 60 from the end of the foil 62.

That is, at least part of the debris D captured by the foil trap 60 moves on the foil 62 of the foil trap 60 in a radial direction due to the centrifugal force, detaches from the end of the foil 62, scatters into the space section 71, and adheres to the inner surface of the cover member 70. The cover member 70 is heated by a heating means (cover heating section), which is not shown in the figure, and the debris D adhering to the inner surface of the cover member 70 is not solidified by the heating and remains in the liquid phase. The debris D adhering to the inner surface of the cover member 70 collects at the bottom of the cover member 70 by gravity and is discharged out of the cover member 70 through a discharge pipe 73 provided at the bottom of the cover member 70 as waste material.

The discharge pipe 73 serves to discharge the debris D collected from the space section 71 toward the outside of the cover member 70. In the present embodiment, the discharge pipe 73 is formed in a tubular shape and is communicated with the space section 71 at the bottom of the cover member 70. The waste material (debris D) discharged from the discharge pipe 73 to the outside of the cover member 70 is contained in a debris receiving section 74 provided at the bottom of the vacuum chamber 3. This configuration allows the cover member 70 to prevent the debris D detached from the end of each foil 62 of the foil trap 60 from scattering into the interior of the vacuum chamber 3.

The debris receiving section 74 is a vessel disposed in a manner to hermetically cover a through-hole 75 from the outside of the chamber body 14, the through-hole 75 being provided in the bottom face of the chamber body 14 and facing the discharge pipe 73. The debris D contained in the debris receiving section 74 may be cooled and stored in a solid phase, or may be stored in a liquid phase when the debris receiving section 74 is provided with a heating mechanism that heats the debris D above its melting point.

Here, for example, when a debris mitigation device including a rotary foil trap is employed in an LDP method EUV light source apparatus, the central axis (rotation shaft) of the rotary foil trap (hub) is disposed such that the plasma (emission point) is located on the extended line of the central axis. Since there are numerous virtual lines passing through the plasma, the orientation of the rotary foil trap with respect to the plasma is determined by aligning any of the above-mentioned virtual lines with the above-mentioned central axis, provided that the radiation emitted toward the utilization apparatus reaches the utilization apparatus via the space between the blades (foils) of the rotary foil trap. In other words, the orientation can be set relatively arbitrarily. In the EUV light source apparatus of the LDP method, the plasma emitting EUV is generated in the space between a pair of electrodes.

On the other hand, the light source apparatus 1 according to the present embodiment employs the LPP method in which radiation material (plasma raw material 23) supplied to the front surface 22a of the rotation body 22 is irradiated with the energy beam EB to generate the high-temperature plasma P in the vicinity of the front surface. In this case, debris released simultaneously with the generation of the plasma P is mostly distributed in the normal direction of the front surface 22a of the rotation body 22. Hence, the foil trap 60 according to the present embodiment is located to align its central axis with the normal direction of the front surface 22a (radiation raw material supplying plane) of the rotation body 22. Furthermore, the cover member 70 surrounding the plurality of foils 62, on the surface facing the plasma P, encloses the point intersecting the central axis and the relative vicinity of the point, and is provided with the first opening 701 to fourth opening 704 that allows only radiation incident to the emission chamber 5 and the radiation diagnostic section 29 to pass through. This configuration makes it possible to block a relatively large amount of the emitted debris on the surface of the cover member 70 facing the plasma P, thereby preventing debris from entering the respective openings 701 to 704.

In addition, since the cover member 70 is heated by the heating means (cover heating section), the debris D that arrives at and adheres to the surface of the cover member 70 facing the plasma P does not solidify and remains in the liquid phase, as shown in FIG. 6. This attached debris D moves to the bottom of the cover member 70 surface (front section by gravity and detaches downward from the cover member The debris D that has detached from the cover member 70 is stored in the debris receiving section 74 provided on the lower side of the vacuum chamber 3 in the form of droplets, for example.

This configuration allows the radiation R1 entering the emission chamber 5 and the radiation R2 entering the radiation diagnostic section 29 to consequentially pass through the vicinity of the outer circumferential face of the foil 62 in the foil trap 60 (i.e., they pass through an area away from the shaft member 61). Hence, debris D traveling in the emission direction of the radiation R1 and R2 also adheres to the front surface of the foil trap 62 farther away from the shaft member 61, not the front surface of the foil 62 closer to the shaft member 61. This makes the centrifugal force acting on the adhered debris D greater, which in turn makes the debris D moving on the foil 62 in a liquid state move at a higher speed, thus the debris D quickly detaches from the end of the foil 62 and adheres to the inner surface of the cover member 70. In other words, this configuration is capable of detaching debris D that has been captured on the foil 62 to the cover member 70 in a shorter time.

Furthermore, as shown in FIG. 1, the gas nozzle 77 capable of ejecting gas at a relatively high speed to a space between the emission chamber 5 and the rear section 70b of the foil trap 60 can be provided. The gas nozzle 77 is configured as a gas supply section (first gas supply section) that forms air, between the foil trap 60 and the emission chamber 5, flowing from the emission chamber 5 toward the shaft member 61 (normal direction (NA) of the front surface 22a of the rotation body 22).

The gas nozzle 77 is disposed in the chamber body 14, in a manner that, for example, a gas flow is formed in a direction from the emission chamber 5 toward the radiation diagnostic section 29. Releasing gas from the gas nozzle 77 makes it possible to further suppress debris (debris that fails to be captured by the foil trap 60) that has been released outside through the second opening 702 of the cover member 70 from entering the emission chamber 5. In addition, the gas released from the gas nozzle 77 enters the inside of the cover member 70 through the second opening 702, hence the pressure of the space section 71 is increased more than that of the vacuum chamber 3, thereby expecting to have the effect of suppressing the entry of debris into the space section 71.

In the foil trap 60 of the present embodiment, as shown in FIG. 4, the shaft member 61 is disposed in the between-axes area that is an area between the first axis (emission axis EA), which is the principal axis of the radiation R1 emitted from the rotation body 22 toward the emission chamber 5, and the second axis, which is the principal axis of the radiation R2 emitted from the rotation body 22 toward the radiation diagnostic section 29. This configuration allows one foil trap 60 to simultaneously capture the debris traveling toward the emission chamber 5 and the radiation diagnostic section 29.

As described above, the hub 64 of the foil trap 60 is formed in a conical trapezoidal shape, hence the plurality of foils 62 attached to the circumferential face of the hub 64 are arranged to be tilted at a predetermined angle toward the rotation body 22 with respect to the axis direction of the shaft member 63. As shown in FIG. 4, setting the predetermined angle allows the plurality of foils 62 to extend from the shaft member 61 in a direction orthogonal to both of the first axis (the principal axis of radiation R1) and the second axis (the principal axis of radiation R2). This configuration enables each foil 62 to be closer to the emission point of the plasma P, thereby minimizing the protrusion length of each foil 62 in the radial direction necessary for capturing debris scattered toward the emission chamber 5 and the radiation diagnostic section 29, resulting in downsizing the foil trap 60, and enhancing the degree of freedom of arrangement of the foil trap 60 in the vacuum chamber 3, which has a limited space.

Furthermore, as shown in FIG. 1, in the light source apparatus 1 of the present embodiment, the optical axis (incident axis IA) of the energy beam EB that radiates to the rotation body 22 onto which the plasma raw material 23 has been applied, the optical axis or principal axis (emission axis EA) of the radiation R (X-ray or EUV) emitted toward the collector 33 (emission chamber 5), and the normal direction with respect to the front surface 22a of the rotation body 22 onto which the plasma raw material 23 has been applied are all different from each other.

Typically, debris consisting of liquid raw material released upon the vaporization of liquid raw material located on a plane by an energy beam is released the most in the normal direction of the plane. In the present embodiment, since the optical axis of the energy beam EB (incident axis IA), the optical axis in the direction of extracting the radiation R (emission axis EA), and the normal direction are all different from each other as described above, this configuration is capable of suppressing the entry of debris into the incident chamber 4 of the energy beam EB and the emission chamber 5.

Furthermore, as shown in FIG. 1, in the light source apparatus 1 according to the present embodiment, the gas nozzle 37 is provided as a gas supply section (second gas supply section) to eject gas in a direction that is different from the optical axis of the energy beam EB (incident axis IA), the optical axis of the radiation R (emission axis EA), and the normal direction of the front surface 22a of the rotation body 22 (axis direction of shaft member 61), which are all different each other, and a direction in which the gas crosses the three directions described above and finally reaches the normal direction. Since the gas nozzle 37 ejects gas at a relatively high speed and the gas reaches the normal direction of the front surface 22a of the rotation body 22 after crossing the optical axis of the energy beam EB (incident axis IA) and the optical axis of the radiation R (emission axis EA), at least part of the debris released in the normal direction is made to be moved away to a direction farther from the optical axis of the energy beam EB (incident axis IA) and the optical axis of the radiation R (emission axis EA). Therefore, it is possible to further suppress the entry of debris in the incident direction of the energy beam EB (incident chamber 4) and the emission direction of the radiation R (emission chamber 5).

Other Embodiments

The embodiments of the present invention have been described above. However, the present invention is not limited to the embodiments described above; it is obvious that the embodiments may be modified in various ways.

For example, in the above embodiment, the shaft member 61 (rotation shaft) of the foil trap 60 is disposed to be parallel to the normal direction (NA) of the front surface 22a of the rotation body 22; however, the shaft member 61 can be disposed at any other positions provided that it is located in the between-axes area that is defined as an area between the principal axis of the radiation R1 entering the emission chamber 5 (first axis, emission axis EA) and the principal axis of the radiation R2 entering the radiation diagnostic section 29.

The above-mentioned embodiments describe, as an example, the light source apparatus 1 provided with both of the gas nozzle 77 as the first gas supply section and the gas nozzle 37 as the second gas supply section. However, in the case where the foil trap 60 and gas being supplied from the gas nozzle 77 as the first gas supply section achieves the effects of suppressing the debris from entering the emission chamber 5, the gas nozzle 37 as the second gas supply section may be omitted. In this case, the gas supply from the gas injection channel 32 to the emission chamber 5 can also be omitted.

What is claimed is:
1. A light source apparatus comprising:
a disk-shaped rotation body;

a raw material supply mechanism that supplies a front surface of the rotation body with liquid raw material that is irradiated with an energy beam to generate plasma;

a chamber body including a beam introduction section that introduces the energy beam, a radiation extraction section that extracts radiation from the plasma that has been generated, and a plasma generation section that accommodates the rotation body; and a foil trap including a shaft member rotatably disposed in the chamber body and a plurality of foils radially arranged around the shaft member, the plurality of foils being arranged between the rotation body and the radiation extraction section to capture debris that has been generated from the plasma.

2. The light source apparatus according to claim 1, wherein the front surface of the rotation body is a plane perpendicular to a rotation axis of the rotation body, and the shaft member is disposed along a direction parallel to the rotation axis of the rotation body.

3. The light source apparatus according to claim 1, wherein the foil trap further includes a cover member that has a space section that accommodates the plurality of foils in a rotatable manner, and the cover member includes a first opening that allows the radiation to enter the space section, and a second opening that is communicated with the space section and that allows the radiation that has been incident through the first opening to emit toward the radiation extraction section.

4. The light source apparatus according to claim 3, wherein the cover member further includes a discharge pipe through which debris that has been collected from the space section is discharged toward an outside of the cover member.

5. The light source apparatus according to claim 3, further comprising a diagnostic section disposed in the chamber body to analyze the radiation, wherein the cover member further includes a third opening that allows the radiation to enter the space section, and a fourth opening that is communicated with the space section and allows the radiation that has been incident through the third opening to emit toward the diagnostic section.

6. The light source apparatus according to claim 5, wherein the shaft member is disposed in a between-axes area that is defined as an area between a first axis that is a principal axis of radiation emitting from the rotation body toward the radiation extraction section, and a second axis that is a principal axis of radiation emitting from the rotation body toward the diagnostic section.

7. The light source apparatus according to claim 6, wherein the plurality of foils extends from the shaft member in a direction orthogonal to each of the first axis and the second axis.

8. The light source apparatus according to claim 1, wherein the shaft member is disposed along a direction different from each of an optical axis of the energy beam that is incident from the beam introduction section onto the rotation body and a principal axis of the radiation emitting from the rotation body toward the radiation extraction section.

9. The light source apparatus according to claim 8, further comprising a first gas supply section between the foil trap and the radiation extraction section, the first gas supply section forming air flowing from the radiation extraction section toward the shaft member.

10. The light source apparatus according to claim 8, further comprising a second gas supply section that forms air flowing across a direction of an axis of the shaft member, a direction of the optical axis of the energy beam, and a direction of the principal axis of the radiation.

11. The light source apparatus according to claim 1, wherein the beam introduction section includes a cylindrical-shaped incident protrusion protruding toward an inside of the chamber body, and the incident protrusion includes an incident aperture at the front end thereof.

12. The light source apparatus according to claim 11, wherein the incident protrusion has a cone shape with a cross-sectional area that decreases toward a side of the protrusion.

13. The light source apparatus according to claim 11, wherein the plasma generation section is maintained in a reduced-pressure atmosphere than the beam introduction section.

14. The light source apparatus according to claim 1, wherein the radiation extraction section includes a cylindrical-shaped outer protrusion protruding toward an outside of the chamber body.

15. The light source apparatus according to claim 14, wherein the outer protrusion has a cone shape with a cross-sectional area that decreases toward a side of the protrusion.

16. The light source apparatus according to claim 14, wherein the plasma generation section is maintained in a reduced-pressure atmosphere than the radiation extraction section.

17. The light source apparatus according to claim 1, further comprising a case section that has openings through which the energy beam and the radiation pass and that accommodates the rotation body.

18. The light source apparatus according to claim 1, wherein the radiation includes X-rays or extreme ultraviolet light.

* * * * *